United States Patent [19]

Lenk

[11] Patent Number: 4,894,567
[45] Date of Patent: Jan. 16, 1990

[54] ACTIVE SNUBBER CIRCUIT

[75] Inventor: Ronald J. Lenk, Albuquerque, N. Mex.

[73] Assignee: Honeywell Inc., Minneapolis, Minn.

[21] Appl. No.: 258,560

[22] Filed: Oct. 17, 1988

[51] Int. Cl.$^4$ ................ H03K 17/16; H03K 17/56
[52] U.S. Cl. .................................... 307/542; 307/549; 307/567
[58] Field of Search ............. 307/540, 542, 567, 639, 307/253, 549

[56] References Cited

U.S. PATENT DOCUMENTS

| | | | |
|---|---|---|---|
| 3,571,614 | 3/1971 | Rolstead | 307/253 |
| 4,010,387 | 3/1977 | Akamatsu | 307/253 |
| 4,047,054 | 9/1977 | Ahmed | 307/542 |
| 4,491,742 | 1/1985 | Akamatsu | 307/633 |

Primary Examiner—John Zazworsky
Attorney, Agent, or Firm—Haugen & Nikolai

[57] ABSTRACT

Electronic circuit apparatus for actively clamping high frequency ringing on a semiconductor switch due to leakage inductance. The apparatus includes a capacitor having first and second capacitive plates, the first capacitive plate being connected between the leakage inductance and one side of the switch and a bipolar transistor which is connected at its base to the second capacitive plate and at its collector to the first capacitive plate at the junction between the leakage inductance and one side of the switch. The emitter of the bipolar transistor is connected to the other side of the switch.

1 Claim, 1 Drawing Sheet

ACTIVE SNUBBER CIRCUIT

UNITED STATES GOVERNMENT RIGHTS

The United States Government has supported the design and development of this invention and has certain rights therein as specified in government contract F33657-81-C-2108.

FIELD OF THE INVENTION

This invention relates to electronic circuits for damping high frequency pulses and, more particularly, to an electronic circuit apparatus for actively clamping high frequency ringing on a semiconductor switch due to leakage inductance.

BACKGROUND OF THE INVENTION

In most switch mode power supplies employing semiconductor switches, such as FETs, unwanted high frequency ringing or transient pulses, will be present in the circuit after switching. In the case of FET type switches, the ringing can be observed on the drain. This ringing can usually be a major source of electromagnetic interference (EMI) in such circuits, and is usually controlled by large passive elements, such as capacitors and resistors. In the known art, snubbing or clamping of such unwanted high frequency pulses is usually accomplished with an RC damping circuit. Such known circuitry provides only one pole (in the frequency domain) of suppression, and additional filtering is done at the power connection in the form of large inductors and capacitors. Known circuits, therefore, have the disadvantage of employing many large passive elements. Further, known snubber circuits using linear elements may have insufficient damping or damping at the wrong frequencies. Using such linear elements, circuits are designed to either reduce power in exchange for an excess amount of EMI or to reduce EMI at the expense of losing excess power at lower frequencies.

Such devices are often employed for damping high frequency ringing in a power converter such as a switch mode power supply. Unwanted high frequency ringing is typically in the range of 10 to 25 MHz and may have voltage swings in a range of, for example, 40% of the normal voltage or more. Such circuits may also have trouble responding to variations in supply voltage, having an RC time constant.

The invention overcomes the disadvantages of the prior art by using a transistor to remove most of the high frequency components from the switching circuit, thus providing effectively more than one pole of roll off and reducing power connector filter requirements. Although it dissipates a certain amount of steady-state power, as does the RC-type snubbers it replaces, the loss of power can be less because of the nonlinear characteristics of the circuit of the invention. Since it uses only a capacitor and a low-impedance transistor, it has a short time-constant, and can thus respond rapidly to supply voltage variations.

SUMMARY OF THE INVENTION

Electronic circuit apparatus for actively clamping high frequency ringing on a semiconductor switch due to leakage inductances is disclosed. The apparatus includes a capacitor having first and second capacitive plates, the first capacitive plate being connected between the leakage inductance and one side of the switch and a bipolar transistor which is connected at its base to the second capacitive plate and at its collector to the first capacitive plate at the junction between the leakage inductance and one side of the switch. The emitter of the bipolar transistor is connected to the other side of the switch.

It is a primary object of the invention to actively clamp high frequency ringing on semiconductor switches due to leakage inductance.

It is another object of the invention to reduce EMI with a nonlinear roll off characteristic.

It is a further object of the invention to provide snubbing regardless of variations in supply voltage.

The foregoing objects and advantages of the invention will become apparent to those skilled in the art from the following detailed description of a preferred embodiment when taken in conjunction with the accompanying drawings in which like numerals in the several views refer to corresponding parts.

DETAILED DESCRIPTION OF THE PREFERRED EMBODIMENT

Figure 1:
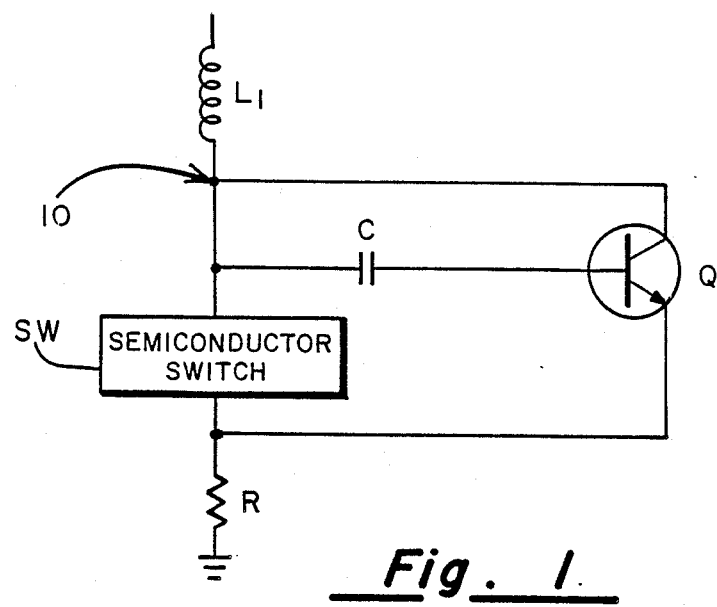
FIG. 1 schematically illustrates one embodiment of the invention.

As best is shown in FIG. 1, a switching circuit employing a switch SW, a leakage inductance L1, a capacitor C, a resistor R, and a bipolar transistor Q, is shown schematically. The switch SW may be any type of two pole semiconductor switching element, such as a MOSFET, SCR, GTO or any similar semiconductor device commonly used for electronic switching. The inductance L1 is representative of leakage inductance in an electronic circuit, for example, a power supply circuit. The transistor Q is a bipolar transistor and may be an NPN or PNP type transistor as will be readily apparent to those skilled in the art. The selection of capacitor C depends upon the level of current being switched by the switch SW.

In one illustrative model of the invention, the switch SW was a MOSFET, the capacitor used has a value of 27 pf and the transistor was a 2N3019 NPN transistor. Of course, this was just one illustrative example of the invention, and those skilled in the art will recognize that there are many variations on this circuit that will still accomplish the results of the invention.

The basic circuit of the invention consists of the capacitor C driving the base of transistor Q with the base current coming from the high frequency noise to be snubbed and the collector doing the snubbing. Low frequency current, such as the fundamental switching frequency, produces little current through the capacitor and thus little collector current. High frequency ringing produces a high degree of base current and turns on the transistor, shunting the high frequency noise through the collector.

Figure 2:
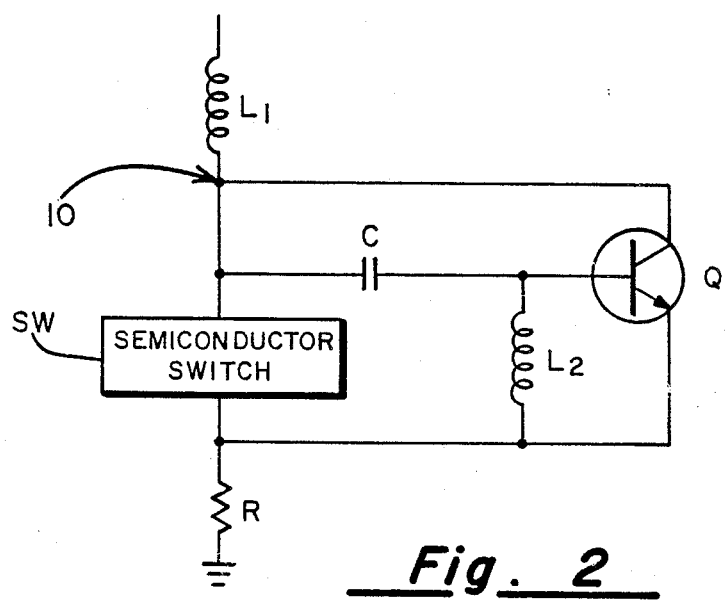
FIG. 2 schematically illustrates an alternative embodiment of the invention.

If the ratio of ringing noise frequency to switching frequency is low, better suppression and lower steady state losses may be achieved with additional poles in the base drive, such as is shown in FIG. 2 with the addition of inductance L2 connected between the base of the transistor and the emitter. This results in even better operation of the snubber because there can be more high frequency conduction and even less low frequency conduction through the transistor, thereby better passing the fundamental switching frequency and snubbing out the high frequency noise pulses.

It should be understood that various combinations of the techniques and principles taught by the present patent may be utilized without departing from the spirit and scope of the invention. Implementations which will be apparent to those skilled in the art are to be considered within the scope of the present invention, so I do not wish to be limited to the specific disclosures used in connection with the preferred embodiment.

What is claimed is:

1. Electronic circuit apparatus for actively clamping high frequency ringing on a semiconductor switch having first and second poles where the ringing is due to leakage inductance comprising:
    (a) a capacitor having first and second capacitive plates wherein the first capacitive plate is connected to the first pole of the switch;
    (b) a bipolar transistor connected at its base to the second capacitive plate, connected at its collector to the first capacitive plate and having its emitter connected to the second pole of the switch; and
    (c) a shunting inductance connected between the base and emitter of the transistor.

* * * * *